United States Patent
Li et al.

(10) Patent No.: US 6,872,657 B2
(45) Date of Patent: Mar. 29, 2005

(54) METHOD TO FORM COPPER SEED LAYER FOR COPPER INTERCONNECT

(75) Inventors: Chaoyong Li, Singapore (SG); Dao Hua Zhang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 14 days.

(21) Appl. No.: 10/638,235

(22) Filed: Aug. 8, 2003

(65) Prior Publication Data

US 2005/0032368 A1 Feb. 10, 2005

(51) Int. Cl.$^7$ .......................................... H01L 21/4763
(52) U.S. Cl. ...................... 438/638; 438/679; 438/680; 438/628; 438/643; 438/644; 438/629
(58) Field of Search .................. 438/638, 679–680, 438/628–629, 643–644

(56) References Cited

U.S. PATENT DOCUMENTS

| | | | | |
|---|---|---|---|---|
| 6,303,498 B1 | * | 10/2001 | Chen et al. | 438/675 |
| 6,306,732 B1 | | 10/2001 | Brown | 438/468 |
| 6,355,106 B1 | * | 3/2002 | Zheng et al. | 118/697 |
| 6,358,848 B1 | * | 3/2002 | Lopatin | 438/687 |
| 6,391,776 B2 | | 5/2002 | Hashim et al. | 438/687 |
| 6,528,884 B1 | * | 3/2003 | Lopatin et al. | 257/758 |
| 2002/0068449 A1 | | 6/2002 | Hashim et al. | 438/687 |
| 2002/0119657 A1 | | 8/2002 | Gandikota et al. | 438/687 |

* cited by examiner

*Primary Examiner*—Luan Thai
(74) *Attorney, Agent, or Firm*—George D. Saile; Stephen B. Ackerman

(57) ABSTRACT

Copper seed layers for use in damascene structures are commonly deposited by CVD because of their superior step coverage. However, these films have poor adhesion to the barrier layer. This problem has been overcome by preceding the deposition of the CVD copper layer with a metal plasma treatment that lays down a very thin layer of copper while the structure receiving it is maintained at a temperature below about −40 C. This is followed by a short exposure to a nitrogen bearing plasma. The results is a seed layer having excellent step coverage as well as very good adhesion to the underlying barrier layer.

32 Claims, 5 Drawing Sheets

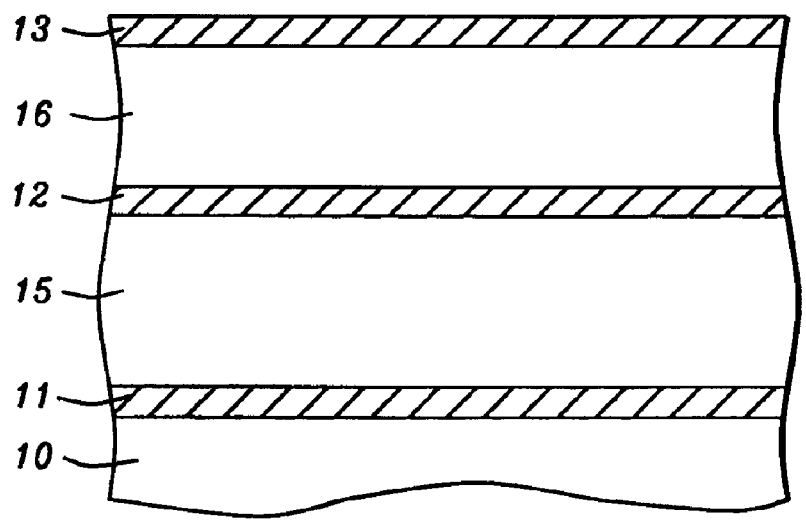
FIG. 1 – Prior Art
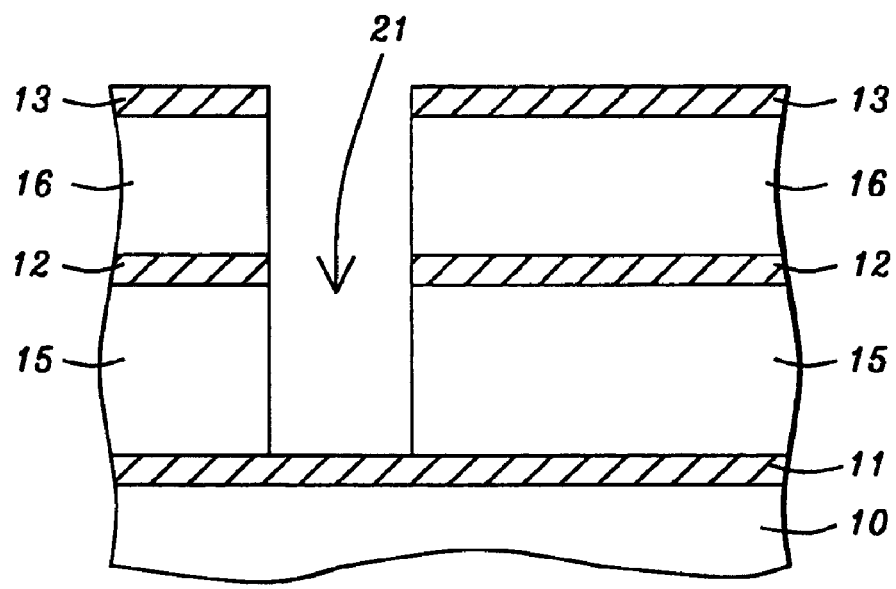
FIG. 2

METHOD TO FORM COPPER SEED LAYER FOR COPPER INTERCONNECT

FIELD OF THE INVENTION

The invention relates to the general field of integrated circuits with particular reference to copper based damascene connectors.

BACKGROUND OF THE INVENTION

Integrated circuits are widely used in electronic devices of many types. Conventional aluminum and aluminum alloys have been widely used as interconnection materials for integrated circuits. However, the downscaling of metal interconnect lines and the increase in electrical current density result in greater RC time delay along with enhanced electromigration and stress induced $V_{bid}$ failures. To solve these functionality and reliability problems, an intense research effect has been focused on copper metalization due to its low bulk resistivity (1.68 µohm cm for Cu, compared to 2.7 µohm cm for Al), excellent electro-migration resistance, and high resistance to stress. However, copper metalization processes require a copper seed layer which is thin and has conformal step-coverage for eletroplating (ECP) or physical vapor deposition (PVD) trench-fill. The quality of the copper seed layer strongly affect the properties of the film that fills the trench, including crystalline quality, film adhesion strength, stress, and reliability within integrated circuits.

PVD Cu is known to be one of the best techniques for depositing a Cu seed layer due to its good physical step-coverage, good adhesion strength, particularly to diffusion barrier metal layer such as TiN, Ta and TaN. However, PVD Cu processes have been found to be less suitable when it becomes necessary to obtain uniform coverage of high aspect ratio trench and via side walls of the type seen in dual damascene structures. In this respect, Chemical Vapor Deposition (CVD) techniques have an advantage since they are able to achieve a high level of step-coverage (>80%).

CVD would therefore appear to be the technique of choice for Cu seed layer formation, particularly for next generation dual damascene technology. However, the Cu adhesion strength to the underneath layer (typically a diffusion barrier layer) is bad, it not being able even to pass the standard Scotch tape test. The grain structure of CVD Cu seed layers is another important factor. The surface roughness of CVD Cu seed layers may cause non uniform growth of subsequently deposited ECP Cu films, resulting in voids and incomplete gap filling. The texture of a CVD Cu seed also influences Cu interconnection failure induced by electromigration (EM) when applying higher current densities in ultra large scale integration circuits. It is well known that a <111> crystalline texture, including barrier layer and Cu film, brings improved Cu interconnections and increases EM endurance. However, CVD Cu seed layers tend to have a preferred <200> orientation rather than a <111> when deposited on some barrier materials.

Currently, PVD Cu remains the technique of choice for preparing Cu seed layers but CVD Cu processes are being considered for the next generation, because of its superior step coverage. The present invention discloses how CVD Cu may be used while at the same time, having good adhesion and a <111> preferred orientation.

A routine search of the prior art was performed with the following references of interest being found:

In US 2002-011,965,711 Gandikota et al. show a Cu process with a metal plasma CVD nucleation layer. In US 2002-0,068,449 A1 Hashim et al. disclose a Cu seed layer process with a metal plasma CVD nucleation layer while in U.S. Pat. No. 6,391,776 B2 Hashim et al. disclose a Cu seed layer process. Brown shows a Cu dual damascene process with a barrier layer in U.S. Pat. No. 6,306,732 B1.

SUMMARY OF THE INVENTION

It has been an object of at least one embodiment of the present invention to provide a method of forming a copper seed layer, having good step coverage, for a copper metalization interconnection in semiconductor integrated circuits.

Another object of at least one embodiment of the present invention has been to allow a seed layer for copper metalization to be formed using standard CMOS process steps with dual damascene technology.

Still another object of at least one embodiment of the present invention has been that said seed layer have good adhesion to the barrier layer used with said damascene technology.

A further object of at least one embodiment of the present invention has been that said seed layer have good lattice continuity relative to said barrier layer, thereby increasing the electromigration resistance of the structure.

These objects have been achieved by preceding the deposition of the CVD copper layer with a very thin copper layer that was deposited using an ionized metal plasma at −40 C followed by treatment in a nitrogen bearing plasma. The result is a seed layer having excellent step coverage as well as very good adhesion to the underlying barrier layer. Instead of the <200> crystalline orientation normally obtained with CVD seed layers of the prior art (when deposited on some metals), a <111> orientation is obtained, making for improved lattice continuity with the barrier layer.

BRIEF DESCRIPTION OF THE DRAWINGS

FIG. 1 shows the initial layered structure that is to be processed.

FIG. 2 is FIG. 1 after a via hole has been etched.

DESCRIPTION OF THE PREFERRED EMBODIMENTS

Figure 3:
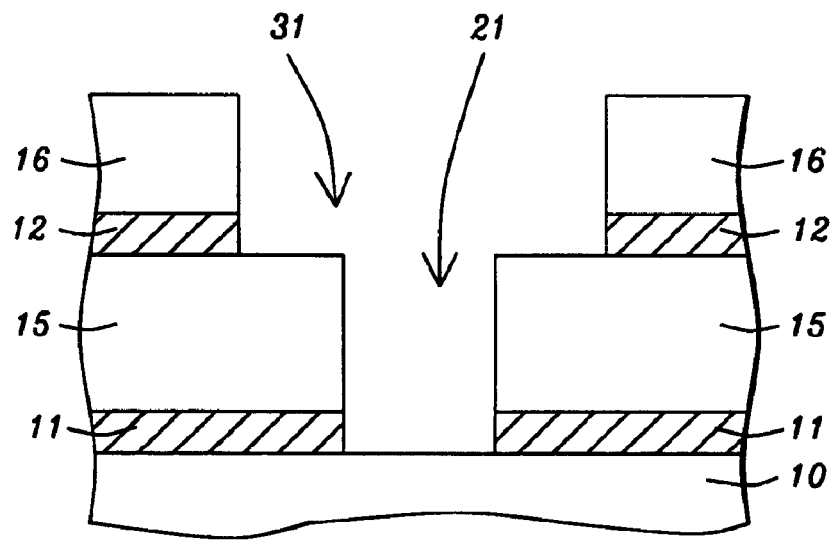
FIG. 3 is FIG. 2 after a trench has been etched and cleaned using plasma and chemical means.

We will illustrate the process of the present invention through a description of its application to filling damascene trenches and vias, but it will be clear to all skilled in the art that the invention is more general than this and may be applied to copper coating of other, non-planar surfaces. Referring now to FIG. 1, the process begins with the provision of partially completed integrated circuit 10 onto whose top surface are deposited, in succession, etch stop layer 11, dielectric layer 15, etch stop layer 12, dielectric layer 16, and cap layer 13. Suitable materials for layers 15 and 16 include silicon oxide, black diamond (methyl-doped porous silica), CORAL (carbon doped silicon oxide), PORA (carbon doped silicon oxide), and SiLK (low k organic polymer), while for the etch stop and cap layers, suitable materials include silicon nitride and silicon carbide.

The next step, as shown in FIG. 2, is to etch via 21 that extends as far as etch stop layer 11. Typically, via 21 has a depth of between about 0.5 and 1.3 microns and a diameter of between about 0.1 and 0.3 microns. Then trench 31 is etched. It extends down as far as etch stop layer 12 and has a depth of between about 0.25 and 0.5 microns and a width of between about 0.1 and 0.3 microns. Then, etch stop layers 11 and 12 and cap layer 13 are etched, following which plasma and chemical treatments are used to strip polymer residues. Following this, all exposed surfaces are coated with barrier layer 32 which is a refractory metal such as Cr, Nb, Ti, Mo, W, or Ta, or one of their nitrides. The appearance of the structure at this stage is shown in FIG. 3.

Figure 4:
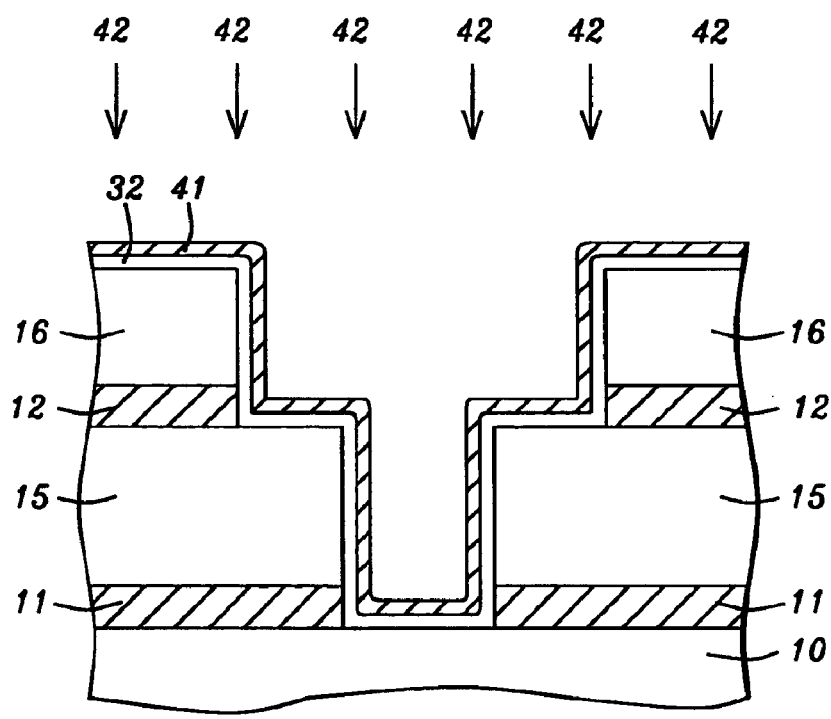
FIG. 4 illustrates the deposition of a barrier layer followed by application of a metal plasma treatment.

Now follows a key feature of the invention, namely the use of a metal plasma technique (such as RF, DC, or magnetron sputtering and symbolized by arrows 42 in FIG. 4) to deposit very thin layer of copper 41 on barrier layer 32 while maintaining the latter (in practice the entire structure) at a temperature less than about −40 C. This metal plasma technique is applied for between about 2 and 10 seconds which results in a copper film whose thickness is between about 10 and 50 Angstroms. Layer 41, when deposited under these conditions, is found to have a preferred <111> crystalline orientation.

Figure 5:
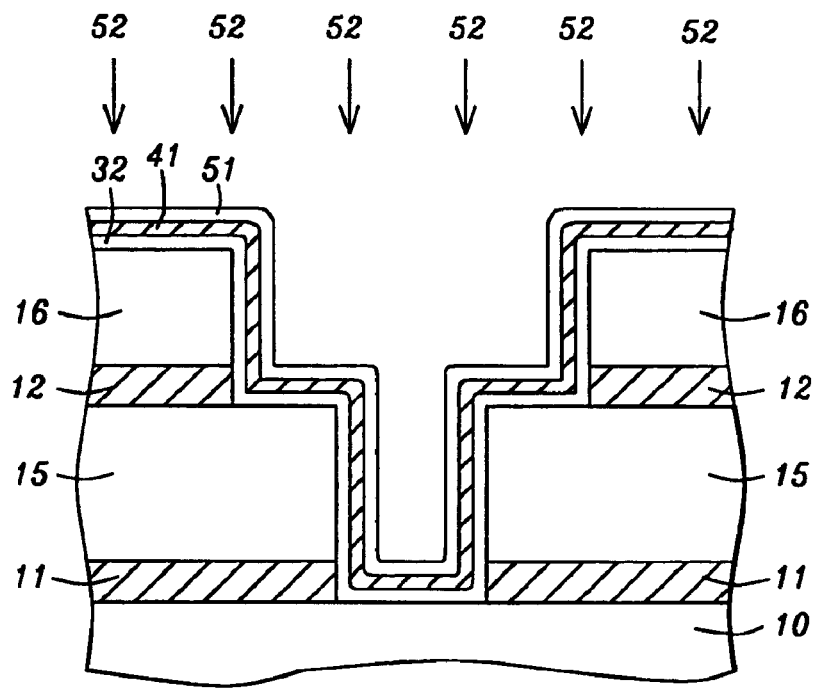
FIG. 5 illustrates the application of a nitrogen plasma treatment to FIG. 4 followed by deposition of a CVD Cu layer.

Copper layer 41 is then exposed to a nitrogen bearing plasma, as symbolized in FIG. 5 by arrows 52. Examples of suitable gases used to generate this nitrogen bearing plasma include (but are not limited to) nitrogen, ammonia, or forming gas (nitrogen+about 10% hydrogen). To generate the nitrogen bearing plasma, one of these gases is taken to a pressure between about $1 \times 10^{-2}$ and $6 \times 10^{-2}$ torr and a plasma is electrolessly excited therein at a power level of between about 100 and 300 watts. The plasma is typically applied for between about 5 and 30 seconds.

Following the plasma treatment, a second (and thicker) layer of copper 51 is laid down by means of chemical vapor deposition. Our preferred process for this includes use of Cupraselect (trimethyl-vinyl-silyl hexafluoro-acetylacetonate copper} along with products such as Hfac (hexafluoroacetyl acetonate dihydride) and TMVS (trimethyl vinyl silane), only under optimized conditions, and layer 51 is deposited to a thickness of between about 200 and 800 Angstroms. Under these deposition conditions, layer 51 ends up achieving a step coverage of at least 90%. Additionally, the non-uniformity of layer 51 was improved from about 11% down to about 4% (based on sheet resistance measurements).

This completes formation of the seed layer onto which additional copper may then be deposited through electroplating until via hole 21 and trench 31 are completely filled with copper, thus forming the dual damascene structure.

Results

Figure 6A:
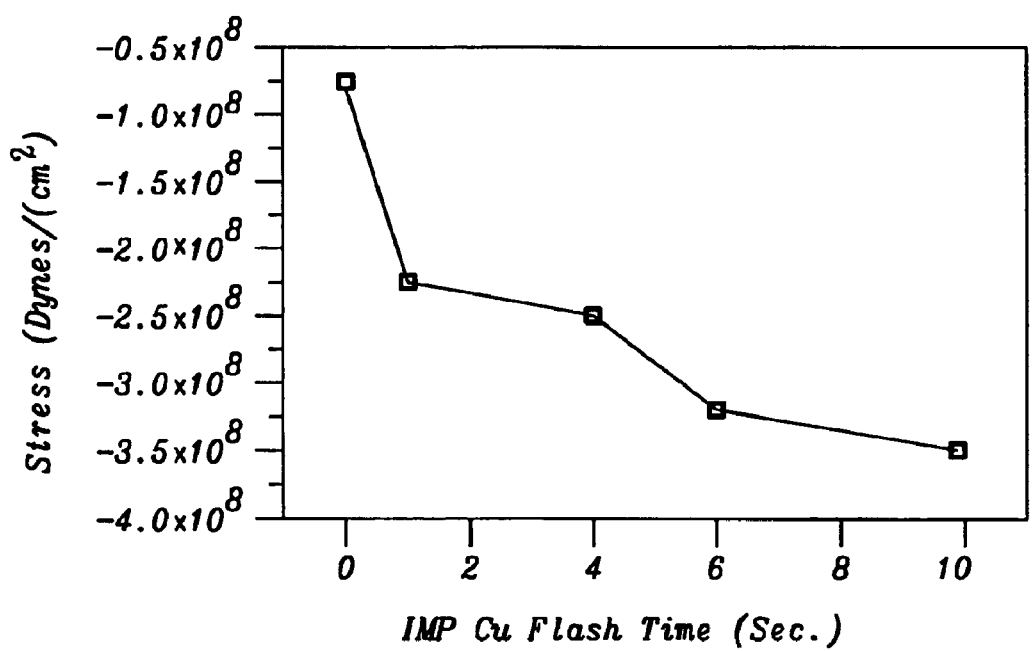
FIG. 6A plots room temperature residual stress as a function of PVD Cu plasma treatment time for C films deposited by CVD.
Figure 6B:
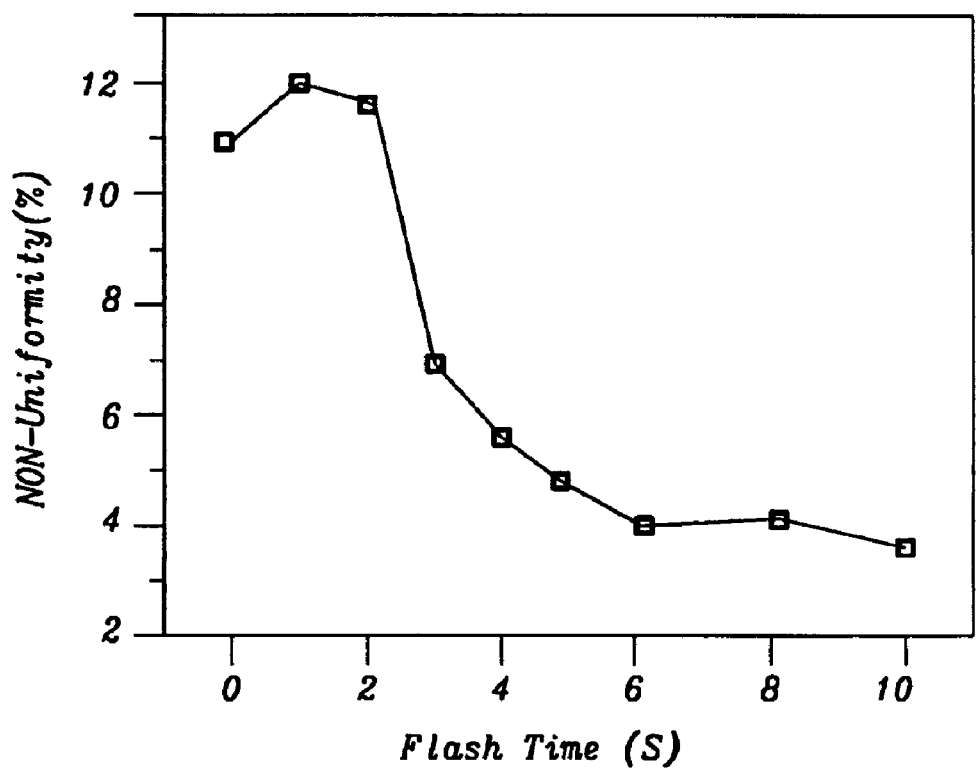
FIG. 6B plots non-uniformity of sheet resistance as a function of the duration of said metal plasma treatment.

1) Stress and Sheet Resistance Measurements:

FIG. 6A shows the residual stress (at room temperature), as a function of the preceding PVD Cu plasma treatment time, for Cu films deposited by CVD. The film thickness was fixed at 150 nm to eliminate thickness as a variable. The residual stress of CVD Cu films is tensile. Without the PVD Cu plasma treatment, the structure was essentially amorphous, at the CVD Cu and barrier layer interface, having large pores and voids, indicating a lower tensile stress level. As the PVD Cu plasma treatment time increased, the tensile stress also increased (became more negative), probably due to smaller pores and voids and a better inter-connected atomic network. When the PVD Cu plasma treatment was long enough (about 2 seconds), the amorphous-like layer disappeared and was replaced by epitaxially grown copper with larger grains. It appears that the PVD Cu plasma treatment provides nucleation centers for the subsequent CVD Cu deposition. As shown in FIG. 6B, The non-uniformity of CVD Cu films (based on sheet resistance measurements) was improved from about 11% down to about 4%.

2) Adhesion Measurements:

The adhesion strength of the copper layer 41 to the barrier layer layer 32 (see FIG. 4) was good enough to pass the standard Scotch tape test. In contrast, a CVD Cu layer film deposited directly on the diffusion barrier metal layer could not pass this relatively mild test. Auger analysis results showed that the failure occurred at the CVD copper-barrier layer interface. However, all CVD Cu films prepared as described above (i.e. with a preceding PVD Cu plasma treatment) could pass the standard Scotch tape test.

Figure 7:
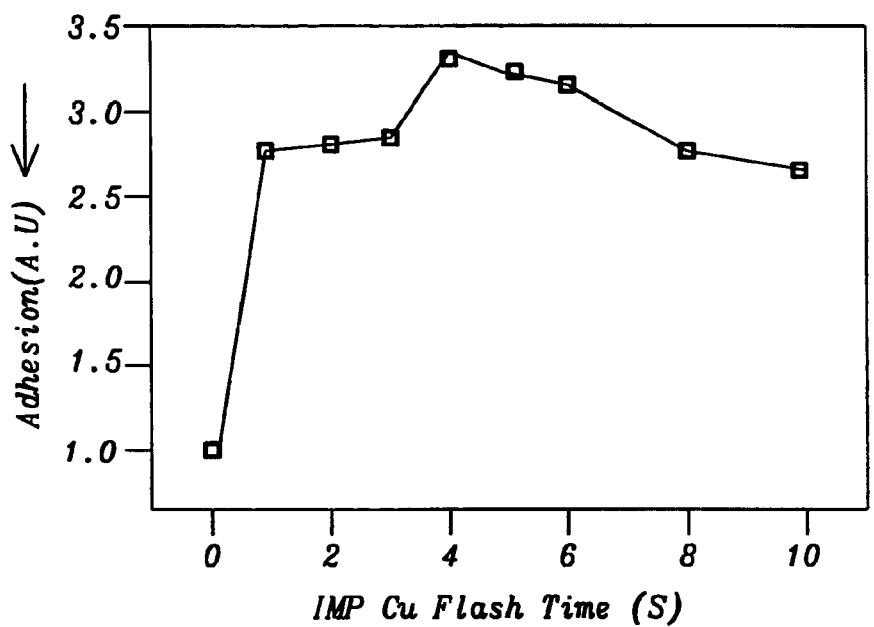
FIG. 7 plots adhesion of the seed layer as a function of the duration of said metal plasma treatment.

This is illustrated in FIG. 7 where the adhesion of CVD films (normalized relative to Cu CVD films deposited according to the prior art) has been plotted as a function of the duration of the metal plasma treatment. As can be seen, a metal plasma treatment of only about two seconds is sufficient to more than double the relative adhesion. Expressed in absolute units, the adhesion of the CVD films (deposited in accordance with the process of the present invention) exceeded 650 N in a stud pull test.

Figure 8:
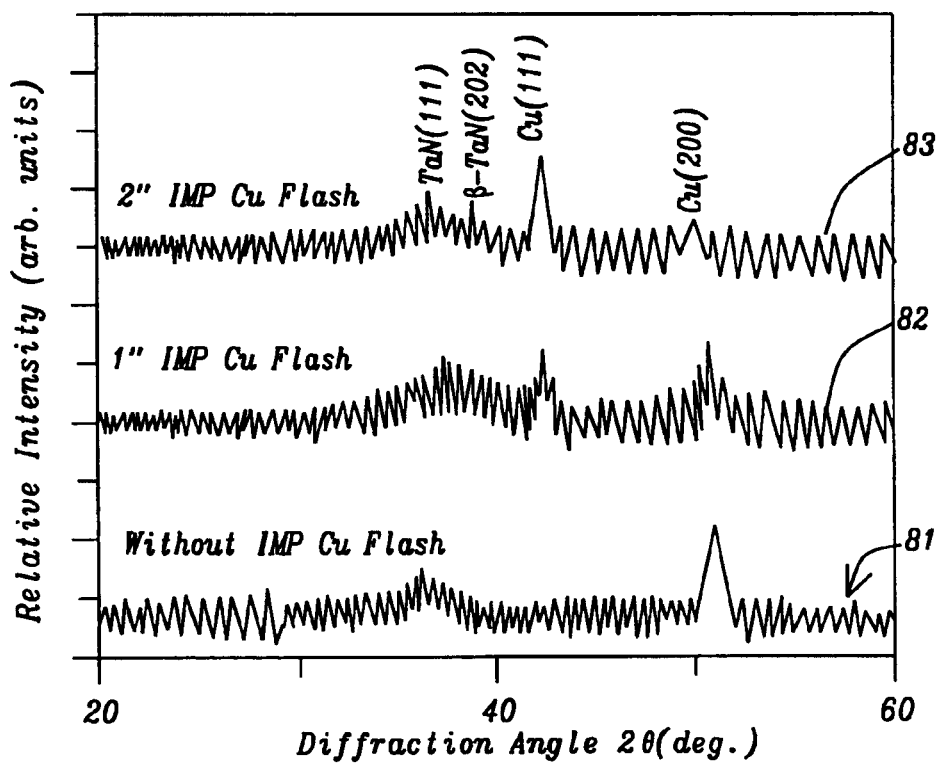
FIG. 8 compares several X-ray diffraction spectra as a function of the duration of said metal plasma treatment.

3) X-ray diffraction (XRD):

FIG. 8 compares the XRD patterns for CVD Cu films after various treatment times to the PVD Cu plasma. FIG. 81 is for no pre-treatment, FIG. 82 for a one second metal plasma treatment and FIG. 83 is for a two second treatment. No noticeable changes can be observed for the TaN peak (from the barrier layer) with or without PVD Cu plasma treatment. However, the copper <111> peak is seen to have increased significantly with plasma pre-treatment while the copper <200> peak has become weaker. This confirms that the PVD Cu under-layer is effective to enhance the CVD Cu <111> texture, implying an enhancement of lattice continuity between the CVD Cu layer and the barrier layer. This serves to increase the electro-migration resistance of the structure. A Siemens XRD system used to generate the data.

What is claimed is:

1. A process to form a copper seed layer on a non-planar surface, comprising:

while maintaining said surface at a temperature less than about −40 C, depositing a first layer of copper by means of a metal plasma technique;

then exposing said surface and said first copper layer to a nitrogen bearing plasma; and then, by means of chemical vapor deposition, depositing a second layer of copper on said surface and said first copper layer.

2. The process described in claim 1 wherein said metal plasma technique is RF sputtering, magnetron sputtering, or DC sputtering.

3. The process described in claim 1 wherein said metal plasma technique is applied for between about 2 and 10 seconds.

4. The process described in claim 1 wherein said first layer of copper is deposited to a thickness of between about 10 and 50 Angstroms.

5. The process described in claim 1 wherein said first layer of copper has a preferred <111> crystalline orientation.

6. The process described in claim 1 wherein said nitrogen bearing plasma is nitrogen, ammonia, or forming gas.

7. The process described in claim 1 wherein said nitrogen bearing plasma is applied at a pressure of between about $1\times10^{-2}$ and $6\times10^{-2}$ torr.

8. The process described in claim 1 wherein said nitrogen bearing plasma is applied for between about 5 and 30 seconds.

9. The process described in claim 1 wherein said nitrogen bearing plasma is applied at a power level between about 100 and 300 watts.

10. The process described in claim 1 wherein the step of depositing a second layer of copper by means of chemical vapor deposition further comprises use of cupraselect with hfac and TMVS.

11. The process described in claim 1 wherein said second layer of copper is deposited to a thickness of between about 200 and 800 Angstroms.

12. The process described in claim 1 wherein said second layer of copper has a sheet resistance non-uniformity of less than 4%.

13. The process described in claim 1 wherein said second layer of copper achieves a step coverage of at least 90%.

14. A process to form a dual damascene structure, comprising:

providing a partially completed integrated circuit having a top surface;

depositing a first etch stop layer on said top surface;

depositing a first dielectric layer on said first etch stop layer;

depositing a second etch stop layer on said first dielectric layer;

depositing a second dielectric layer on said second etch stop layer;

depositing a cap layer, having an upper surface, on said second dielectric layer;

etching a via hole that extends downwards through said second dielectric layer and said second etch stop layer as far as said first etch stop layer then etching a trench that extends downwards from said upper surface through said cap and second dielectric layers as far as said second etch stop layer;

then using plasma and chemical means to strip away any polymeric residues;

then coating all exposed surfaces with a barrier layer having a surface;

while maintaining said structure at a temperature less than about −40 C, depositing, by means of a metal plasma technique, a first layer of copper on said barrier layer surface;

then exposing said first copper layer to a nitrogen bearing plasma;

by means of chemical vapor deposition, depositing a second layer of copper on said first copper layer, thereby forming a seed layer; and then electro-depositing copper on said seed layer until said via hole and trench are completely filled with copper, thereby forming said dual damascene structure.

15. The process described in claim 14 wherein said metal plasma technique is RF sputtering, magnetron sputtering, or DC sputtering.

16. The process described in claim 14 wherein said metal plasma technique is applied for between about 2 and 10 seconds.

17. The process described in claim 14 wherein said first layer of copper is deposited to a thickness of between about 10 and 50 Angstroms.

18. The process described in claim 14 wherein said first layer of copper has a preferred <111> crystalline orientation.

19. The process described in claim 14 wherein said nitrogen bearing plasma is nitrogen, ammonia, or forming gas.

20. The process described in claim 14 wherein said nitrogen bearing plasma is applied at a pressure of between about $1\times10^{-2}$ and $6\times10^{-2}$ torr.

21. The process described in claim 14 wherein said nitrogen bearing plasma is applied for between about 5 and 30 seconds.

22. The process described in claim 14 wherein said nitrogen bearing plasma is applied at a power level between about 100 and 300 watts.

23. The process described in claim 14 wherein the step of depositing a second layer of copper by means of chemical vapor deposition further comprises use of cupraselect with hfac and TMVS.

24. The process described in claim 14 wherein said second layer of copper is deposited to a thickness of between about 200 and 800 Angstroms.

25. The process described in claim 14 wherein said second layer of copper has a sheet resistance non-uniformity of less than 4%.

26. The process described in claim 14 wherein said second layer of copper achieves a step coverage of at least 90%.

27. The process described in claim 14 wherein said barrier layer is selected from the group consisting of Cr, Nb, Ti, Mo, W, and Ta or a nitride of a member of said group.

28. The process described in claim 14 wherein said trench has a depth of between about 0.25 and 0.5 microns and a width of between about 0.1 and 0.3 microns.

29. The process described in claim 14 wherein said via hole has a depth of between about 0.5 and 1.3 microns and a diameter of between about 0.1 and 0.3 microns.

30. The process described in claim 14 wherein said dielectric layers are silicon oxide, methyl-doped porous silica, carbon doped silicon oxide, or low k organic polymers.

31. The process described in claim 14 wherein said etch stop layers are silicon nitride or silicon carbide.

32. The process described in claim 14 wherein said second layer of copper has an adhesion strength, within said trench and via hole, of at least 650 N.

* * * * *